(12) United States Patent
Taghizadeh Ansari et al.

(10) Patent No.: US 10,367,466 B2
(45) Date of Patent: Jul. 30, 2019

(54) HYBRID VARIABLE GAIN AMPLIFIER

(71) Applicants: Kimia Taghizadeh Ansari, Ottawa (CA); Tyler Neil Ross, Ottawa (CA)

(72) Inventors: Kimia Taghizadeh Ansari, Ottawa (CA); Tyler Neil Ross, Ottawa (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/802,905

(22) Filed: Nov. 3, 2017

(65) Prior Publication Data

US 2019/0140609 A1   May 9, 2019

(51) Int. Cl.
| | |
|---|---|
| H03F 3/45 | (2006.01) |
| H03G 3/30 | (2006.01) |
| H03F 1/32 | (2006.01) |
| H03G 1/00 | (2006.01) |
| H03G 7/06 | (2006.01) |

(Continued)

(52) U.S. Cl.
CPC ......... *H03G 3/3042* (2013.01); *H01J 49/022* (2013.01); *H03F 1/3211* (2013.01); *H03F 3/45183* (2013.01); *H03F 3/601* (2013.01); *H03G 1/0029* (2013.01); *H03G 7/06* (2013.01); *H03F 2203/45246* (2013.01); *H03F 2203/45644* (2013.01)

(58) Field of Classification Search
CPC ...... H03G 3/3042; H03G 1/0029; H03G 7/06; H01J 49/022; H03F 1/3211; H03F 3/45183; H03F 3/601
USPC ....................................................... 330/254
See application file for complete search history.

(56) References Cited

U.S. PATENT DOCUMENTS 5,867,778 A * 2/1999 Khoury ................ H03D 7/1433
                                                      327/359
5,933,771 A * 8/1999 Tiller ................... H03D 7/1433
                                                      330/254

(Continued)

FOREIGN PATENT DOCUMENTS

CN       101627547 A      1/2010
WO       2017172344 A1    10/2017

OTHER PUBLICATIONS

Xiao, J. et al., "A High Dynamic Range CMOS Variable Gain Amplifier for Mobile DTV Tuner", IEEE Journal of Solid-State Circuits, vol. 42, No. 2, pp. 292-301, Feb. 2007.

(Continued)

*Primary Examiner* — Khanh V Nguyen

(57) ABSTRACT

Hybrid variable gain amplifiers and methods of controlling hybrid VGAs are disclosed. The hybrid VGA includes a first portion that provides a current path between a positive input and a positive output, and a current path either between the positive input and a negative output, in a first mode of operation, or between the positive input and a voltage source, in a second mode of operation. A second portion of the VGA provides a current path between a negative input and the negative output, and a current path either between the negative input and the positive output, in the first mode of operation, or between the negative input and the voltage source, in the second mode of operation. Control voltages selectively enable the paths in the first or second mode of operation. The control voltages further control amount of current flow in the enabled paths.

16 Claims, 11 Drawing Sheets

(51) Int. Cl.
  *H03F 3/60* (2006.01)
  *H01J 49/02* (2006.01)

(56) References Cited

U.S. PATENT DOCUMENTS

| | | | | |
|---|---|---|---|---|
| 6,177,839 B1* | 1/2001 | Ishihara | ............... | H03G 1/0023 327/359 |
| 6,392,487 B1* | 5/2002 | Alexanian | ............ | H03G 1/0023 330/254 |
| 6,710,657 B2* | 3/2004 | Yang | ................... | H03F 3/45089 330/254 |
| 6,794,941 B2* | 9/2004 | Wichern | ............. | H03F 3/45089 327/355 |
| 7,042,292 B2* | 5/2006 | Morohashi | ........... | H03G 3/3042 330/254 |
| 7,053,707 B2* | 5/2006 | Fanous | ............... | H03F 3/45183 330/124 R |
| 7,102,435 B2* | 9/2006 | Bosch | ................. | H03G 1/0023 327/359 |
| 7,881,681 B2* | 2/2011 | Kuo | ....................... | H03C 3/406 455/115.1 |
| 8,698,560 B2* | 4/2014 | Li | ............................ | H03F 1/26 327/359 |
| 2010/0061481 A1* | 3/2010 | Litmanen | ................ | H03F 3/195 375/295 |
| 2010/0093291 A1 | 4/2010 | Embabi et al. | | |

OTHER PUBLICATIONS

Kuo, C.-C. et al., "A 71-76 GHz CMOS Variable Gain Amplifier Using Current Steering Technique", 2008 IEEE Radio Frequency Integrated Circuits Symposium, pp. 609-612.

Liu, C. et al., "A 5-Gb/s Automatic Gain Control Amplifier with Temperature Compensation", IEEE Journal of Solid-State Circuits, vol. 47, No. 6, pp. 1323-1333, Jun. 2012.

Liao, C.-F. et al., "A 10Gb/s CMOS AGC Amplifier with 35dB Dynamic Range for 10Gb Ethernet", 2006 IEEE International Solid-State Circuits Conference, Session 28, Wireline Building Blocks, 28.3.

* cited by examiner

HYBRID VARIABLE GAIN AMPLIFIER

TECHNICAL FIELD

The present disclosure relates to variable gain amplifiers (VGAs); in particular, the present disclosure relates to systems for VGAs used in communication systems.

BACKGROUND

Variable gain amplifiers (VGAs), for maintaining a desired level of output signals by adjusting gain, are widely used in radio frequency (RF) communication systems, in particular in transceivers receiving a signal which experiences rapid and wide variations in signal power.

In receivers such as those that may be used in various portable devices or base stations, it is often necessary to control the power of the demodulated signal for proper signal processing. Additionally, in transmitters such as those that may be used in various portable devices or base stations, it is also often useful to control the transmit power in order to avoid excessive interference from other equipment.

Reception and transmission power and gain control are typically performed by an automatic gain control (AGC) circuit using a VGA. It is generally desirable for the AGC to have high linearity and low noise, over a wide range of power levels, such that signals can be received and transmitted with little or no distortion. To achieve the desired AGC characteristics, the dB gain of the VGA should preferably be linearly changed according to a gain control signal over a wide dynamic range.

However, a VGA's performance may degrade significantly over a high dynamic range. For example, sensitivity of a VGA to low level signals may be reduced when the VGA is operating with a very high gain; on the other hand, the input signal may get lost in noise if there is insufficient gain for the VGA to amplify the input signal. Conventional VGA circuits have been found to exhibit deterioration in linearity at upper or lower ranges of gain.

Accordingly, solutions for achieving low noise, high linearity, and sufficient gain range for VGAs are desirable to provide adjustable gain in a variety of applications.

SUMMARY

In some examples, the present disclosure describes a hybrid variable gain amplifier (VGA) that may be used to adjust gain linearly in transceivers with a wide dynamic range. The hybrid VGA is controllable to operate in different modes of operation, according to the desired gain. For example, a first mode of operation can be used to achieve better linearity when the desired gain is low, and a second mode of operation can be used to achieve better linearity when the desired gain is high. In some examples, controlling the operation of the hybrid VGA involves setting control voltages to control operation of transistors in the hybrid VGA.

In some aspects, the present disclosure describes a hybrid VGA. The hybrid VGA includes a positive input and a negative input, a positive output and a negative output. The hybrid VGA also includes a first portion of the VGA that is configured to provide an electrical path for current to flow between the positive input and the positive output. The first portion is also configured to provide an electrical path for current to flow either between the positive input and the negative output, in a first mode of operation, or between the positive input and a voltage source, in a second mode of operation. The hybrid VGA also includes a second portion of the VGA that is configured to provide an electrical path for current to flow between the negative input and the negative output. The second portion is also configured to provide an electrical path for current to flow either between the negative input and the positive output, in the first mode of operation, or between the negative input and the voltage source, in the second mode of operation. Each of the first and second portions of the VGA includes connections to control voltages to selectively enable the electrical paths in the first mode of operation or the electrical paths in the second mode of operation. The control voltages further control amount of current flow in the enabled electrical paths.

In any of the preceding aspects/embodiments, the hybrid VGA may include a plurality of transistors to provide the respective electrical paths. The plurality of transistors include a first transistor coupled between the positive input and the negative output; a second transistor coupled between the positive input and the voltage source; a third transistor coupled between the negative input and the positive output; and a fourth transistor coupled between the negative input and the voltage source. The first, second, third and fourth transistors may be controlled by the control voltages to: enable at least some current to flow across the first and third transistors, and inhibit current flow across the second and fourth transistors, in the first mode of operation; and enable at least some current to flow across the second and fourth transistors, and inhibit current flow across the first and third transistors, in the second mode of operation.

In any of the preceding aspects/embodiments, the first portion of the VGA may include a fifth transistor coupled between the positive input and the positive output, and the second portion of the VGA may include a sixth transistor coupled between the negative input and the negative output. The control voltages may control the first to sixth transistors to selectively enable the electrical paths in the first mode of operation or the second mode of operation by: controlling the first and third transistors to allow at least some current flow and controlling the second and fourth transistors to inhibit current flow, in the first mode of operation; or controlling the second and fourth transistors to allow at least some current flow and controlling the first and third transistors to inhibit current flow, in the second mode of operation.

In any of the preceding aspects/embodiments, the control voltages may include a first control voltage connected to the fifth and sixth transistors, a second control voltage connected to the first and third transistors, and a third control voltage connected to the second and fourth transistors. The first, second and third control voltages may be used together to selectively enable the electrical paths in the first mode of operation or the second mode of operation, and to control amount of current flow in the enabled electrical paths.

In any of the preceding aspects/embodiments, the plurality of transistors may be bipolar junction transistors (BJTs) or heterojunction bipolar transistors (HBTs). The control voltages may be connected to the bases of the transistors to control operation of the VGA to operate in the first mode of operation or the second mode of operation, and to control amount of current flowing in the enabled electrical paths in each mode of operation.

In any of the preceding aspects/embodiments, the plurality of transistors may be metal-oxide semiconductor field-effect transistors (MOSFETs) or high-electron-mobility transistors (HEMTs). The control voltages may be connected to the gates of the transistors to control operation of the VGA to operate in the first mode of operation or the second mode of operation, and to control amount of current flowing in the enabled electrical paths in each mode of operation.

In some aspects, the present disclosure provides a hybrid VGA. The hybrid VGA includes a positive input and a negative input, a positive output and a negative output. The hybrid VGA also includes a first differential amplifier and a second differential amplifier. The first and second differential amplifiers are coupled to each other by the first and second differential amplifiers both including a first common transistor and a second common transistor. The first common transistor is coupled between the positive output and the positive input, and the second common transistor is coupled between the negative output and the negative input. The first differential amplifier further includes a first plurality of transistors cross-connecting the negative input to the positive output and the positive input to the negative output. The second differential amplifier further includes a second plurality of transistors tied to a voltage source. The first and second differential amplifiers include connections to control voltages to control operation of the hybrid VGA in a first mode of operation using the first differential amplifier or in a second mode of operation using the second differential amplifier; and to control current steering in the first differential amplifier when using the first mode of operation, or current steering in the second differential amplifier when using the second mode of operation.

In any of the preceding aspects/embodiments, wherein the control voltages may include a first control voltage connected to the first and second common transistors, a second control voltage connected to the first plurality of transistors in the first differential amplifier, and a third control voltage connected to the second plurality of transistors in the second differential amplifier. The first, second and third control voltages may be used together to control operation of the hybrid VGA in either the first mode of operation or the second mode of operation, and may be used together to control current steering in either the first mode of operation or the second mode of operation.

In any of the preceding aspects/embodiments, the first, second and third control voltages may control the first plurality of transistors to allow at least some current flow and the second plurality of transistors to inhibit current flow, to control operation of the hybrid VGA in the first mode of operation; and may control the second plurality of transistors to allow at least some current flow and the first plurality of transistors to inhibit current flow, to control operation of the hybrid VGA in the second mode of operation.

In any of the preceding aspects/embodiments, the first plurality of transistors may include a third transistor coupled between the positive input and the negative output, and a fourth transistor coupled between the negative input and the positive output. The second plurality of transistors may include a fifth transistor cross-connecting the positive input to the voltage source, and a sixth transistor cross-connecting the negative input to the voltage source. The control voltages may control operation of the hybrid VGA in either the first mode of operation or the second mode of operation by: controlling the third and fourth transistors to allow at least some current flow and controlling the fifth and sixth transistors to inhibit current flow in the first mode of operation; or controlling the fifth and sixth transistors to allow at least some current flow and controlling the third and fourth transistors to inhibit current flow in the second mode of operation.

In any of the preceding aspects/embodiments, the first and second common transistors, the first plurality of transistors and the second plurality of transistors may be bipolar junction transistors (BJTs) or heterojunction bipolar transistors (HBTs). The control voltages may be connected to the bases of the transistors to control operation of the VGA to operate in the first mode of operation or the second mode of operation, and to control current steering in the first differential amplifier when using the first mode of operation, or current steering in the second differential amplifier when using the second mode of operation.

In any of the preceding aspects/embodiments, the first and second common transistors, the first plurality of transistors and the second plurality of transistors may be metal-oxide semiconductor field-effect transistors (MOSFETs) or high-electron-mobility transistors (HEMTs). The control voltages may be connected to the gates of the transistors to control operation of the VGA to operate in the first mode of operation or the second mode of operation, and to control current steering in the first differential amplifier when using the first mode of operation, or current steering in the second differential amplifier when using the second mode of operation.

In some aspects, the present disclosure provides a method for controlling a hybrid VGA. The VGA is controllable to operate in a first mode of operation or in a second mode of operation. In the first mode of operation the hybrid VGA provides an electrical path for current to flow from a positive input to a negative output and from a negative input to a positive output. In the second mode of operation the hybrid VGA provides an electrical path for current to flow from the positive input to a voltage source and from the negative input to the voltage source. The method includes, when a desired gain is below a first threshold value, setting the control voltages to control the hybrid VGA to operate in the first mode of operation. The method also includes when the desired gain is at or above a second threshold value, setting the control voltages to control the hybrid VGA to operate in the second mode of operation. The method also includes further setting the control voltages to achieve the desired gain.

In any of the preceding aspects/embodiments, the first threshold value may be lower in value than the second threshold value. When the desired gain is between the first and second threshold values, the method may include controlling the hybrid VGA to operate in a current mode of operation.

In any of the preceding aspects/embodiments, the first and second threshold values may be equal.

In any of the preceding aspects/embodiments, the hybrid VGA may include a first transistor coupled between the positive input and the negative output; a second transistor coupled between the positive input and the voltage source; a third transistor coupled between the negative input and the positive output; and a fourth transistor coupled between the negative input and the voltage source. Setting the control voltages to control the hybrid VGA to operate in the first mode of operation may include setting the control voltages to enable at least some current to flow across the first and third transistors and inhibit current flow across the second and fourth transistors to turn off. Setting the control voltages to control the hybrid VGA to operate in the second mode of operation may include setting the control voltages to enable at least some current to flow across the second and fourth transistors and inhibit current flow across the first and third transistors to turn off.

BRIEF DESCRIPTION OF THE DRAWINGS

For a more complete understanding of the present invention, and the advantages thereof, reference is now made to the following description taken in conjunction with the accompanying drawings, in which.

Figure 1:
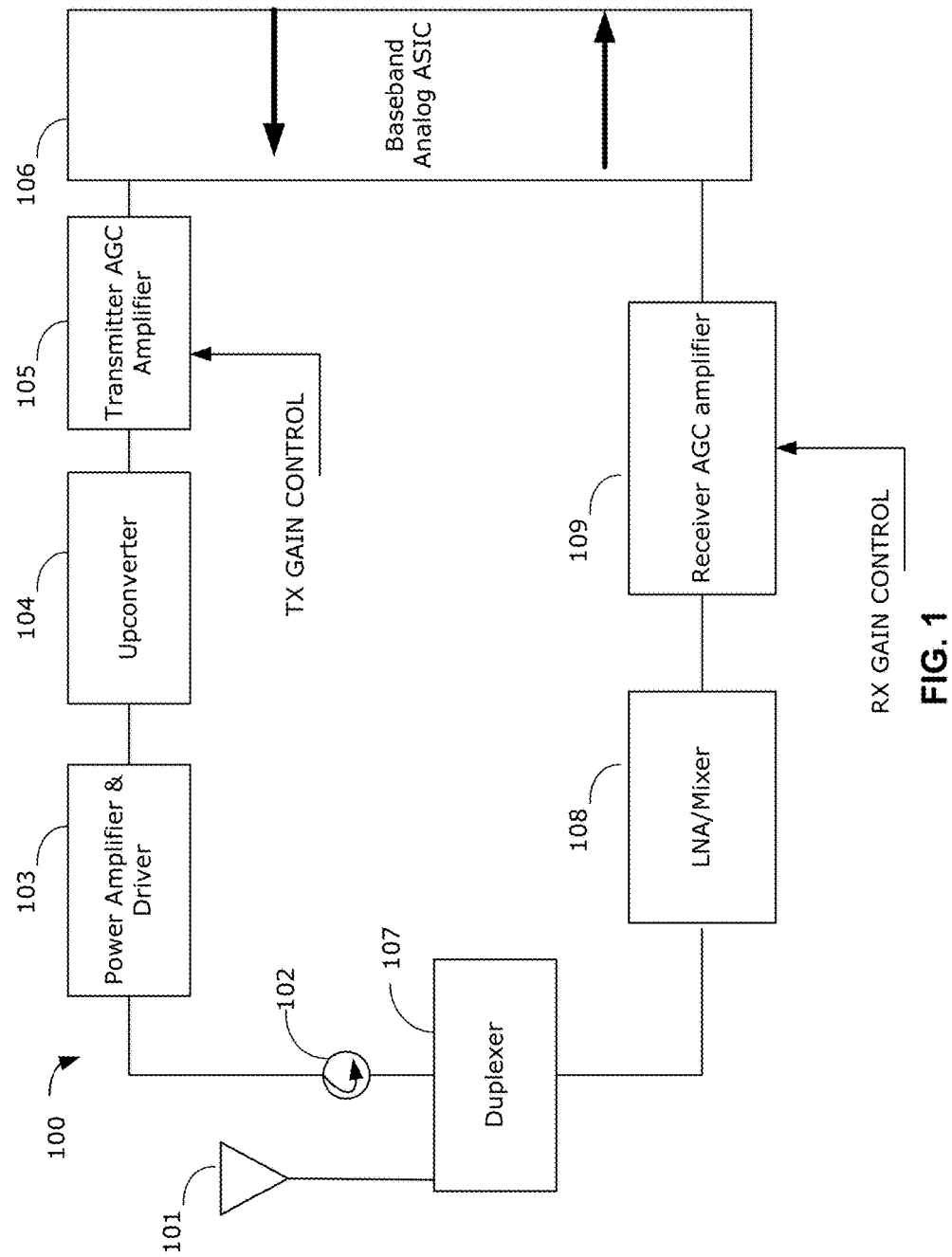
FIG. 1 is a schematic diagram illustrating a transceiver for wireless communication according to example embodiments.

In electronic circuit diagrams, conventional electronic components are labeled with conventional reference letters followed by a number indication the iteration of that element in the circuit. For example, R indicates a resistor, C indicates a capacitor, L indicates an inductor, Q indicates a bipolar junction transistor and M indicates a field-effect transistor. Although examples disclosed herein have been implemented using certain types of components, such as certain types of transistors, it should be understood that these are illustrative only. For example, different types of transistors may be used and/or different types of loads may be used. Each electronic component has a plurality of terminal through which it is connected to wires and other components. However, the use of the word "terminal" does not imply an implementation based on discrete components only, and any circuit described may be implemented as integrated circuit (IC). Further, where considered appropriate, reference numerals may be repeated among the figures to indicate corresponding or analogous elements.

DETAILED DESCRIPTION OF ILLUSTRATIVE EMBODIMENTS

In a radio frequency (RF) communication system, a linearly adjustable hybrid variable gain amplifier (VGA) with high dynamic range may be desirable for use in transceivers. Example methods and systems are described below for a high dynamic range hybrid VGA that may be implemented in a RF communication system to help to improve linearity, with relatively low power consumption.

FIG. 1 is a schematic diagram of a transceiver 100 in which an example hybrid variable gain amplifier, as described herein, may be implemented. In some examples, the architecture shown in FIG. 1 may be implemented in a portable electronic device (sometimes called a user equipment (UE)) or a base station for use in a wireless network, for example a Fifth Generation (5G) wireless communication network. As illustrated in FIG. 1, one VGA is used for a receiver automatic gain control (AGC) amplifier 109 and another VGA is used for a transmitter AGC amplifier 105. The front end receiver portion of the transceiver 100 includes an antenna 101, a duplexer 107, and a low noise amplifier (LAN) and mixer circuit 108. The output of the receiver AGC amplifier 109 is provided to a baseband analog application specific integrated circuit (ASIC) 106 which converts an analog signal to a digital signal. The gain of the receiver AGC amplifier 109 is controlled by a gain control circuit (shown as RX gain control of FIG. 1), which applies a control signal (e.g., a control voltage or a digital control word) to the receiver AGC amplifier 109 to vary the gain of the receiver AGC amplifier 109. Although FIG. 1 shows a baseband analog ASIC 106 and the AGCs 105, 109 operating at baseband, it should be understood that the transceiver 100 may, in some examples, use RF VGAs and AGCs instead.

For transmitting signals, the baseband analog ASIC 106 receives a baseband modulated digital representation of a waveform or a modulated analog representation of a frequency modulation (FM) waveform. Then the baseband analog ASIC 106 converts the baseband signal's representation to analog intermediate frequency (IF) form at a constant signal level and supplies the analog IF form to the transmitter AGC amplifier 105. The transmitter AGC amplifier 105 provides power control to the signal and supplies the power-controlled signal to an upconverter 104. The output from the upconverter 104 is provided to a power amplifier (PA) and driver circuitry 103. The output from the PA and driver circuitry 103 is provided to an isolator 102. The output from the isolator 102 is provided to the duplexer 107. Finally, the duplexed signal outputted from the duplexer 107 is provided to the antenna 101 for transmission. The gain of the transmitter AGC amplifier 105 is controlled by a gain control circuit (shown as TX gain control of FIG. 1), which applies a control signal (e.g., a control voltage or a digital control word) to the transmitter AGC amplifier 105 to vary the gain of the transmitter AGC amplifier 105.

An important operating characteristic of a VGA is linearity, which is a measure of the variation of output signal strength in proportional to input signal strength. Generally, the dB gain of the VGA should preferably be linearly changed according to a gain control signal over a range of input signal amplitudes. A standard measure of the linearity of a VGA is referred to as a third order input intercept point (IIP3). The IIP3 of a VGA is the input power amplitude at which the output power of a fundamental input signal and the output power amplitude of a third order intermodulation product signal have equal magnitude. The greater the value of IIP3 is for a particular VGA, the greater the linearity of that VGA. Likewise, the lower the value of IIP3 for a particular VGA, the lower the linearity of that VGA. One drawback of conventional VGAs is that IIP3 varies significantly as a result of controlling gain of the VGA over a wide dynamic range. For conventional VGAs that use current steering to control gain, the IIP3 varies as the amount of current flowing across the transistor in the signal path varies, as discussed further below with respect to example conventional VGAs. Such variation in IIP3 is undesirable because the linearity of the VGA will be reduced when the gain of the circuit is adjusted to operate at certain levels, resulting in signal distortion.

Figure 2A:
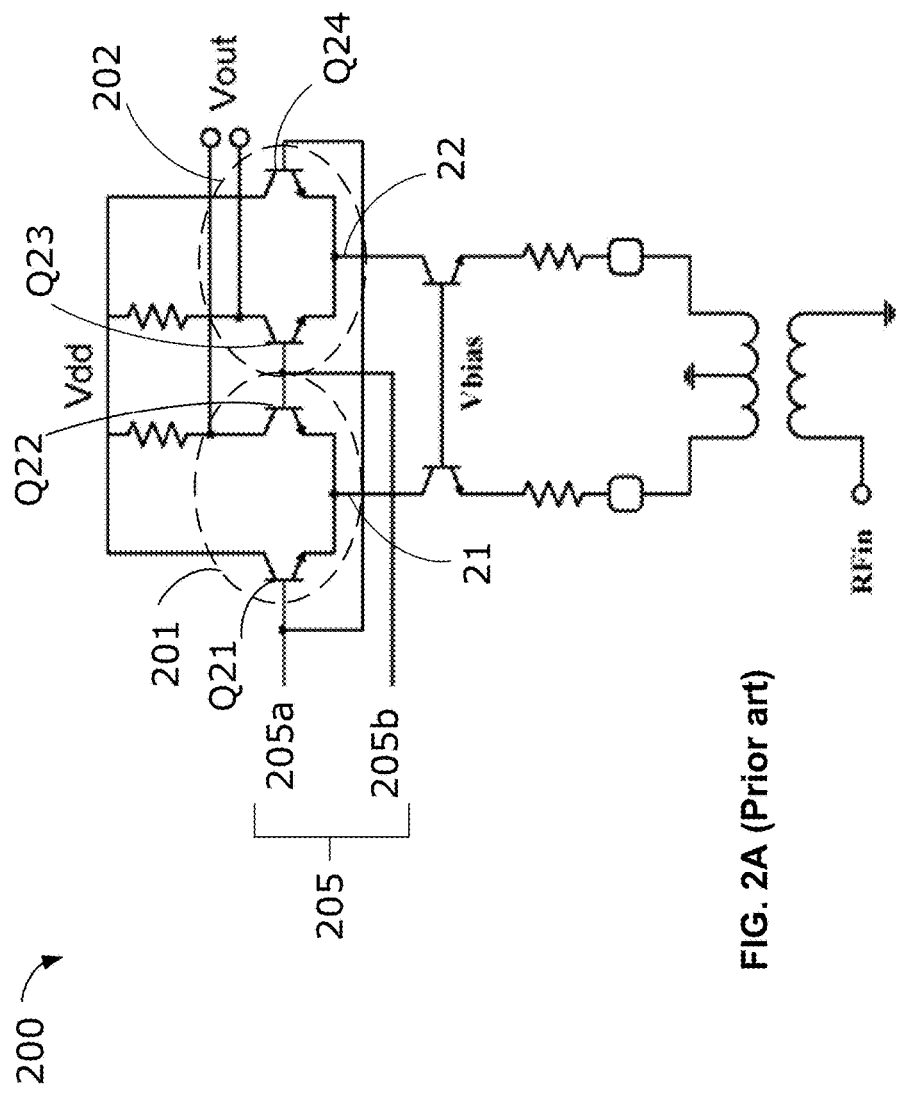
FIG. 2A is a schematic diagram of a variable gain amplifier in prior art.

An example conventional VGA 200 is shown in FIG. 2A. In this approach, the VGA 200 is based on a differential amplifier, and uses current steering to control gain. The differential amplifier includes a positive cell indicated by a dashed circle 201 coupled to a positive input 21, and a negative cell indicated by a dashed circle 202 coupled to a negative input 22. The positive cell 201 includes bipolar junction transistors (BJTs) Q21 and Q22, and the negative cell 202 includes BJTs Q23 and Q24. Each of the transistors in the VGA 200 has a base (B), an emitter (E) and a collector (C) terminal. In some implementations, the transistors may instead be heterojunction bipolar transistors (HBTs). The transistors Q21 and Q24 are connected to a voltage rail Vdd, which may be the highest voltage level supplied on a chip. The gain of the VGA 200 is controlled by varying the amount of current that flows through the transistor Q22 in the positive cell 201, and the transistor Q23 in the negative cell 202 of the differential amplifier. The current that flows through the transistor Q21 in the positive cell is varied such that the total current in the positive cell 201 is substantially constant, and the current that flows through the transistor Q24 is also varied to ensure substantially constant current in the negative cell 202. Control signals 205a and 205b (generally referred to as control signals 205) are applied to transistors Q21 and Q22, respectively, to control the amounts of current flowing in each path of the positive cell 201. Similarly, the control signals 205 are applied to transistors Q23 and Q24 to control the amounts of current flowing in each path of the negative cell 202. Controlling the amount or percentage of current flowing through parallel paths (with the total amount of current flowing through the paths being substantially constant) may also be known as current steering. When the majority of current flows through transistors Q21 and Q24, a small portion of the current flows through transistors Q22 and Q23, and the gain of the VGA 200 will be at or close to its minimum. However, the output signals are significantly or completely suppressed because the transistors Q22 and Q23 are short of current. In this regard, the linearity is poor when gain is at or close to minimum.

Figure 2B:
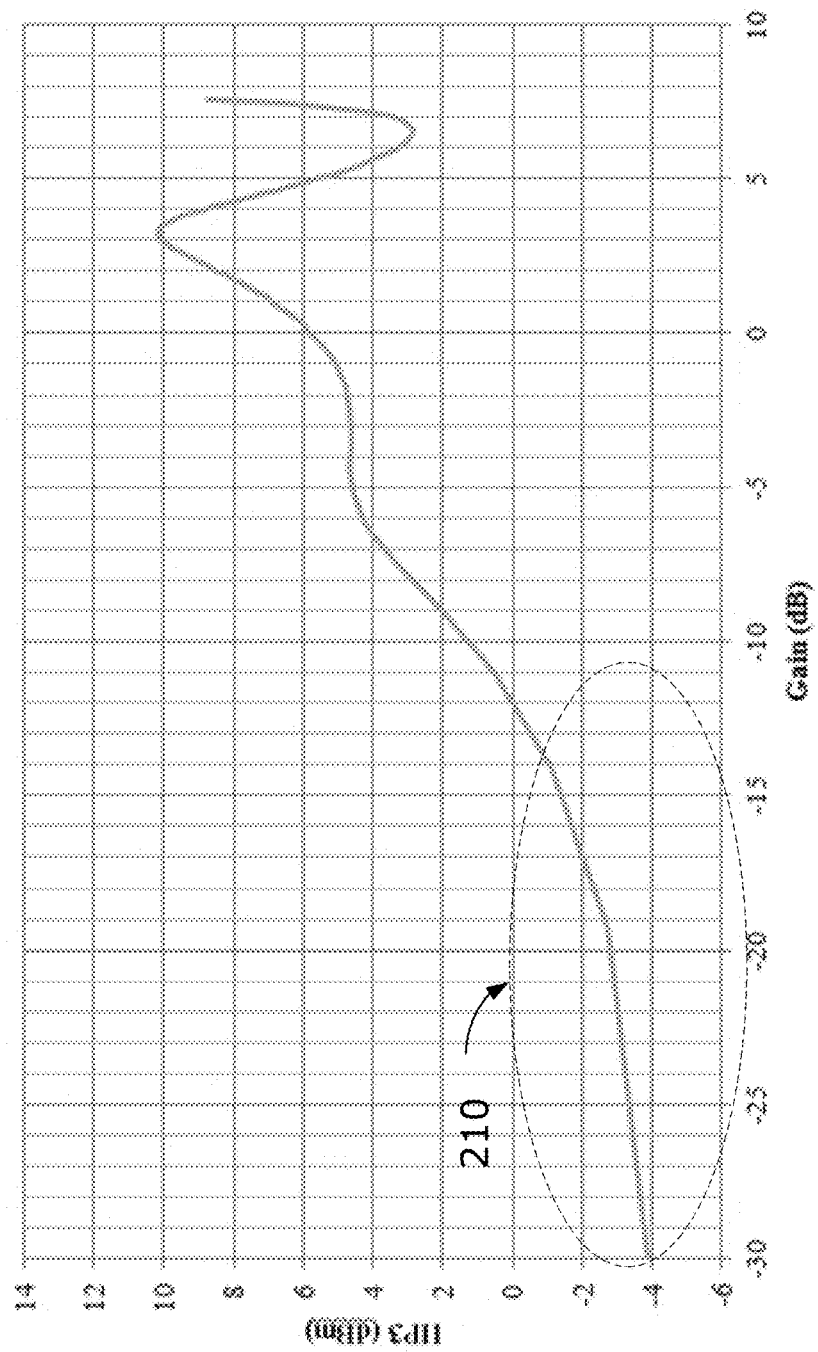
FIG. 2B is a plot of third order input intercept point (IIP3) versus gain of the variable gain amplifier in FIG. 2A.

In the VGA 200, inadequate current flow through transistors Q22 and Q23 leads to decreased linearity at low gain, which is illustrated in FIG. 2B by an IIP3 plot versus gain of the VGA 200. In particular, a decreased linearity in performance is indicated by dashed circle 210. At low gains, the value of the IIP3 decreases significantly for the VGA 200, indicating poor linearity for low gains, which is undesirable if the VGA 200 is to be used for a wide dynamic range of input signals.

Figure 3A:
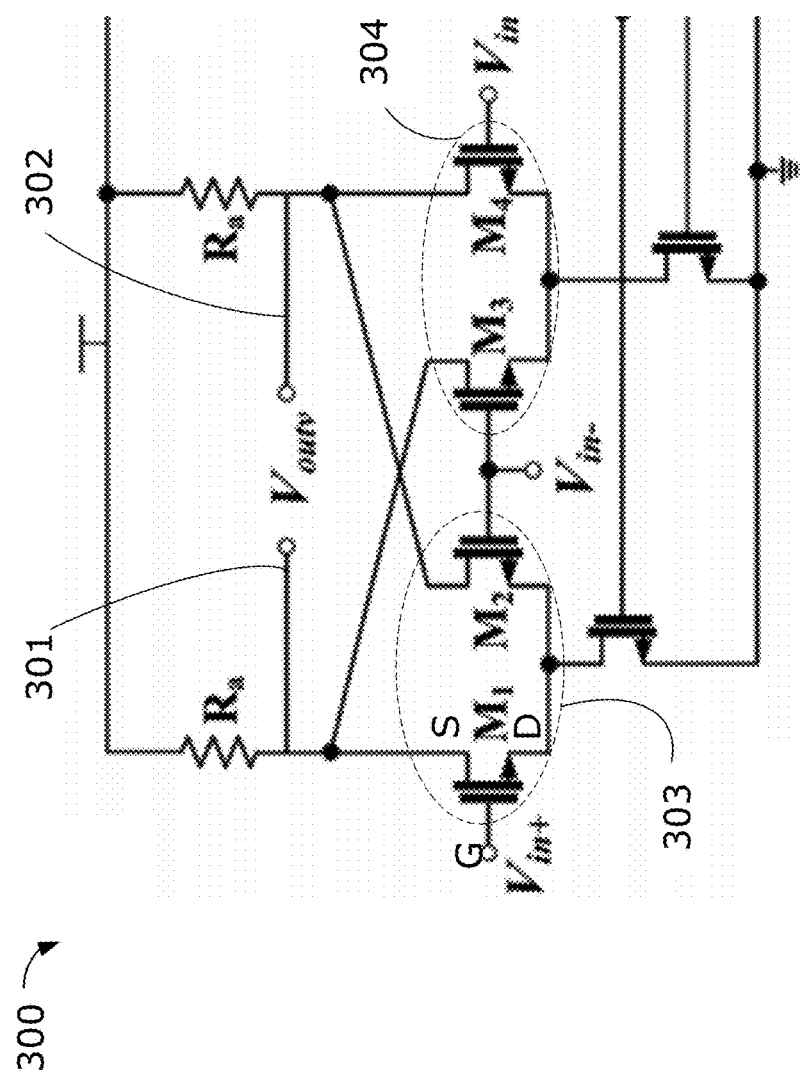
FIG. 3A is a schematic diagram of another variable gain amplifier in prior art.

Another example conventional VGA 300 is shown in FIG. 3A. The VGA 300 is based on a differential amplifier, and uses current steering to control gain. The differential amplifier includes a positive cell indicated by a dashed circle 303 and a negative cell indicated by a dashed circle 304. The positive cell 303 includes field effect transistors (FETs) M1 and M2, and the negative cell 304 includes FETs M3 and M4. Each of the transistors in the VGA 300 has a gate (G), a source (S) and a drain (D) terminal. The source of the transistor M2 is coupled to the negative output 302 which is at the source of the transistor M4. Similarly, the source of the transistor M3 is coupled to the positive output 301 which is at the source of the transistor M1. In the positive cell 303, current is steered between the path across the transistor M1 and the path across the transistor M2; similarly, in the negative cell 304, current is steered between the path across the transistor M3 and the path across the transistor M4. For the VGA 300, when the majority of current flows across transistors M1 and M3, and a small portion of current flows across transistors M2 and M4, the gain of the VGA 300 will be at or close to its maximum. However, inadequate current flow across transistors M2 and M4 may result in the transistors M2 and M4 being turned off or close to being turned off.

Figure 3B:
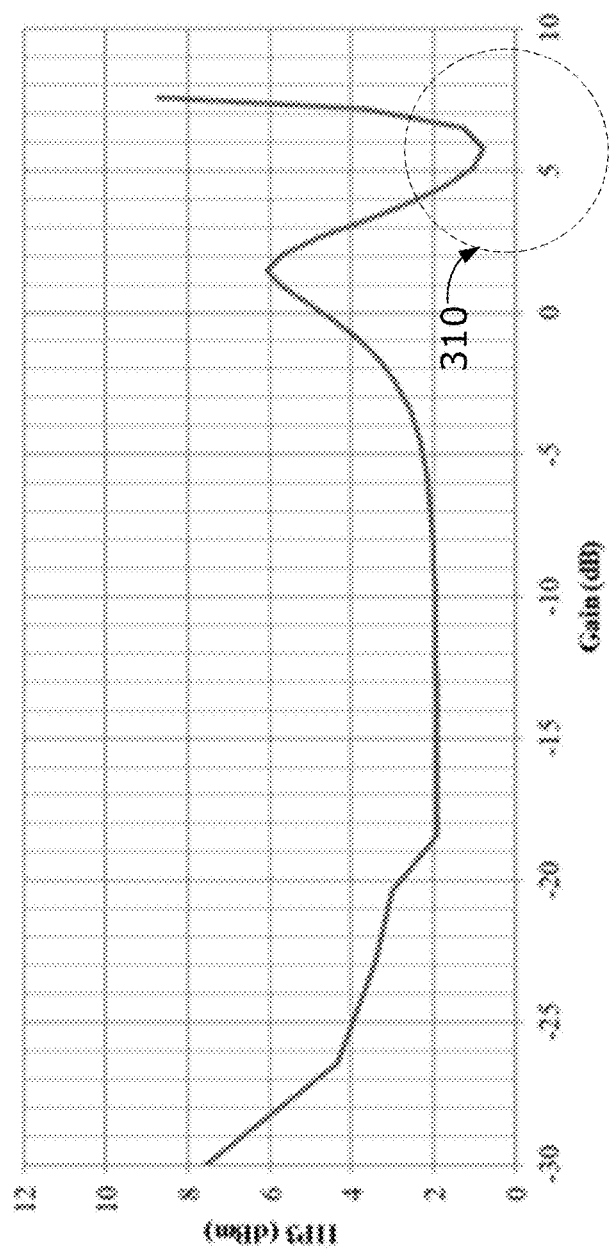
FIG. 3B is a plot of IIP3 versus gain of the variable gain amplifier in FIG. 3A.

FIG. 3B is an IIP3 plot versus gain of the VGA 300. As shown in FIG. 3B, when only a small current is flowing through transistors M2 and M4, the linearity drops significantly. Specifically, the value of the IIP3 decreases significantly when the gain of the VGA 300 is close to its maximum, indicated by a dashed circle 310. This is undesirable if the VGA 300 is to be used for a wide dynamic range of input signals. Moreover, the maximum gain of the VGA 300 is lower due to the transistors M2 and M4 loading the outputs of the amplifier.

The conventional VGAs 200 and 300 discussed above show poor linearity when considering a wide dynamic range. Conventional approaches to address such drawbacks may include improving linearity by increasing the supply voltage or increasing the current, or reducing the gain (which would have to be compensated elsewhere). Such approaches may require greater demand on power consumption and battery life and/or greater complexity elsewhere in the system. Such approaches may not be suitable in certain applications, such as in 5G phased array systems, where there may be hundreds of VGAs and the total increase in power consumption and/or complexity may be significant.

Figure 4A:
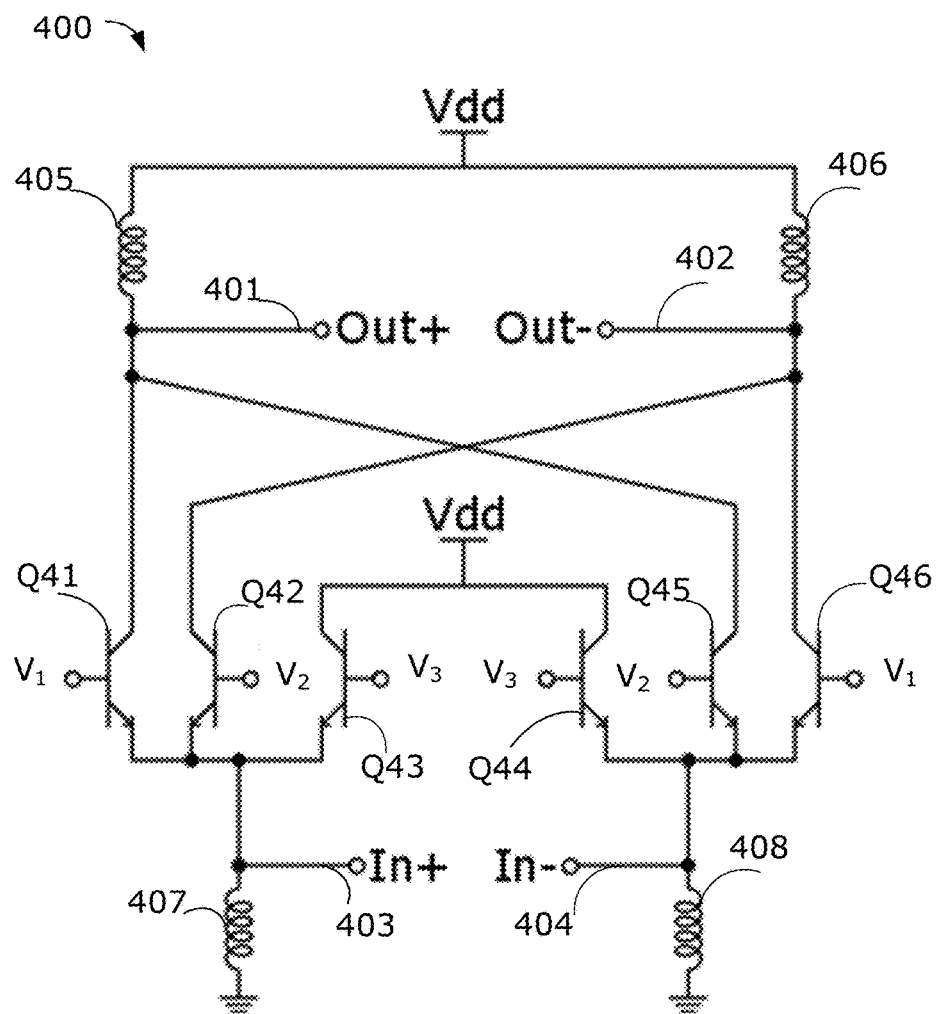
FIG. 4A is a schematic diagram of a hybrid variable gain amplifier according to example embodiments.

A hybrid VGA, as disclosed herein, may help to improve linearity performance over a wide dynamic gain, and may address at least some drawbacks of the above-discussed conventional VGAs. The disclosed hybrid VGA may be used in various applications, including transceivers in portable devices or base stations in wireless communication networks. FIG. 4A is a schematic diagram of a hybrid VGA 400 in accordance with an example embodiment.

Figure 4B:
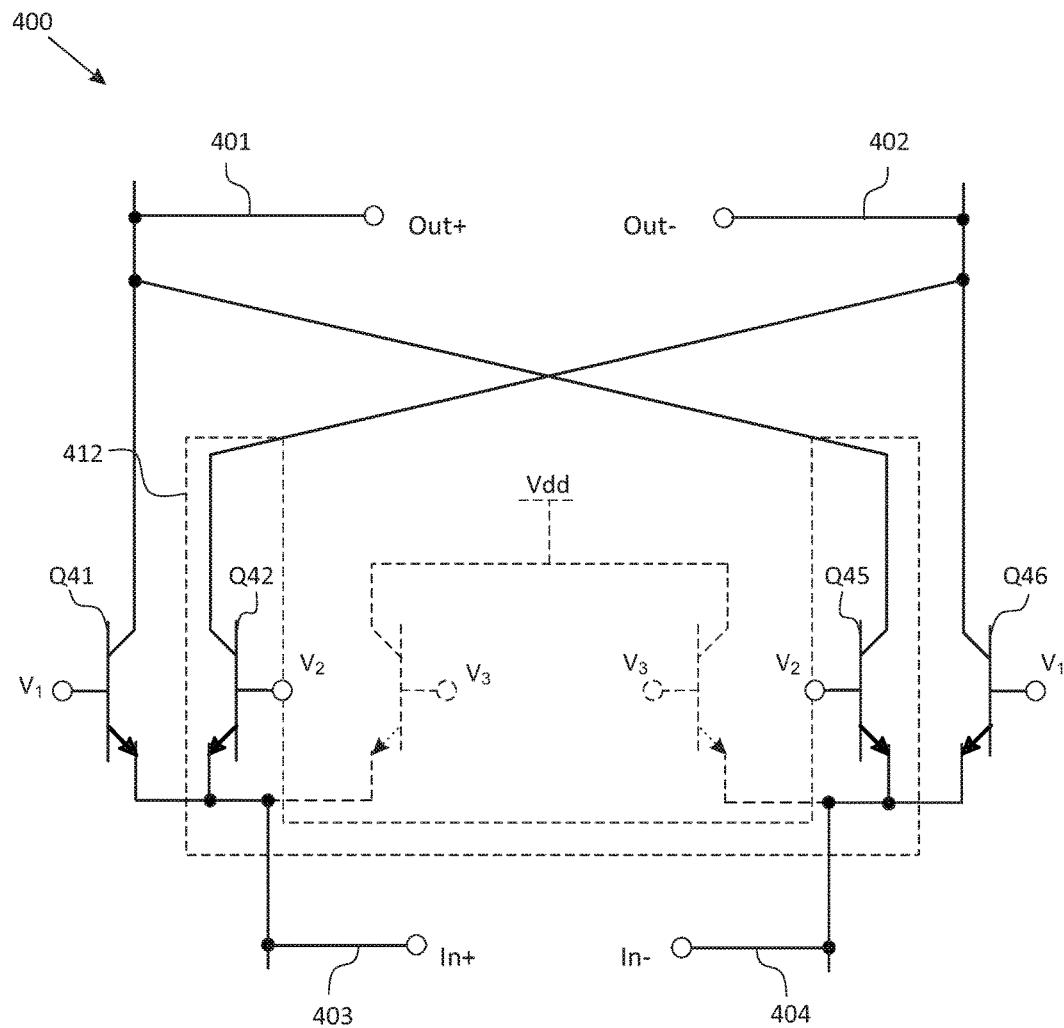
FIG. 4B illustrates electrical paths that are enabled when the example hybrid variable gain amplifier of FIG. 4A is operated in the first mode of operation.
Figure 4C:
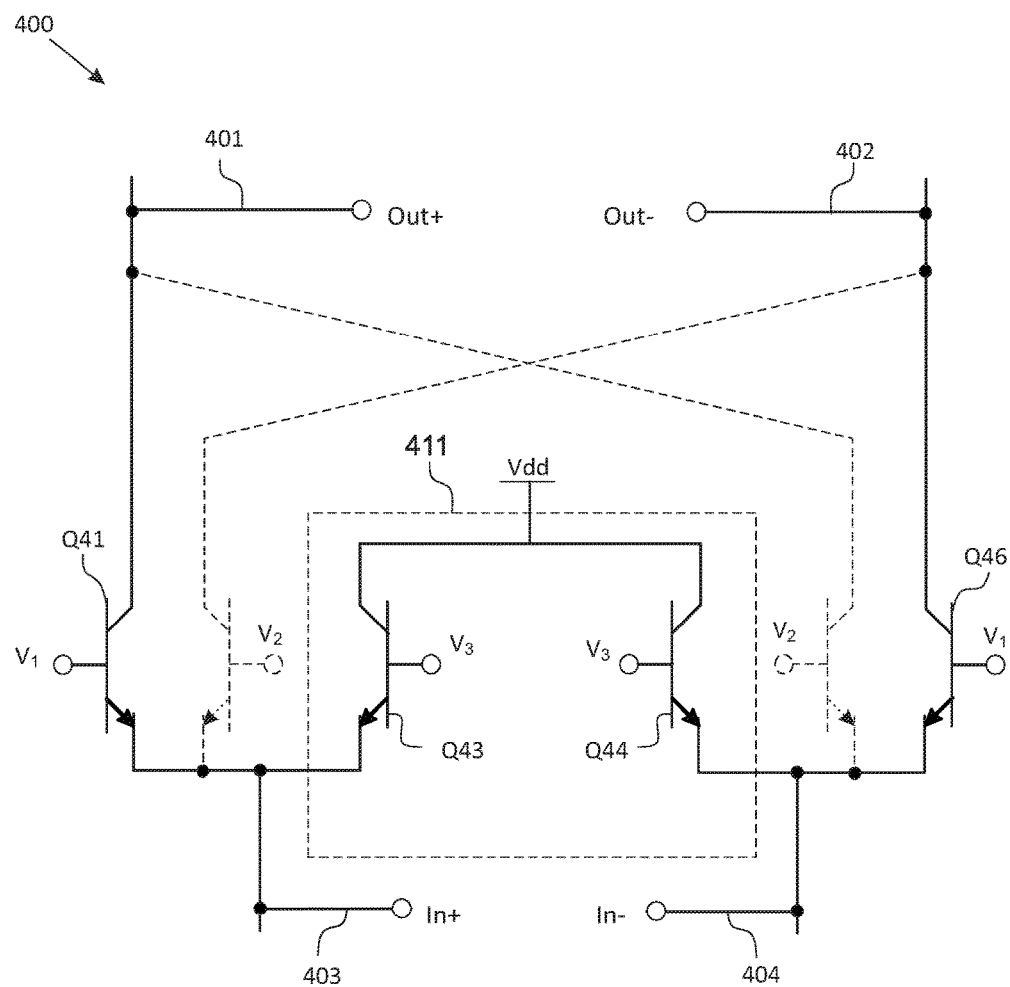
FIG. 4C illustrates electrical paths that are enabled when the example hybrid variable gain amplifier of FIG. 4A is operated in the second mode of operation.

As will be discussed in greater detail below, the hybrid VGA 400 may be controlled to operate in a first mode of operation or a second mode of operation, depending on the desired gain. In the first mode of operation, the electrical paths illustrated in solid lines in FIG. 4B are enabled so that current can flow in those paths, and the electrical paths illustrated in dashed lines in FIG. 4B are disabled so that current flow in those paths is inhibited. In the second mode of operation, the electrical paths illustrated in solid lines in FIG. 4C are enabled so that current can flow in those paths, and the electrical paths illustrated in dashed lines in FIG. 4C are disabled so that current flow in those paths is inhibited. The first and second modes of operation have different linearity characteristics. Thus, one mode of operation may compensate for drawbacks of the other mode of operation. By controlling the hybrid VGA 400 to operate in a particular mode of operation, depending on the desired gain, the overall linearity of the hybrid VGA 400 may be improved, compared to the conventional VGAs discussed previously.

The details of the hybrid VGA 400 are now discussed with respect to FIG. 4A. The hybrid VGA 400 has a positive input 403, a negative input 404, a positive output 401 and a negative output 402. A first portion of the hybrid VGA 400 is associated with the positive input 403, and a second portion is associated with the negative input 404. In the example shown, the first portion includes an electrical path from the positive input 403 to the positive output 401, via the transistor Q41; this electrical path is enabled in both the first and the second modes of operation. The first portion also includes an electrical path from the positive input 403 to the negative output 402, via the transistor Q42; this electrical path is enabled when the hybrid VGA 400 is operating in the first mode of operation. The first portion also includes an electrical path from the positive input 403 to the voltage source Vdd, via the transistor Q43; this electrical path is enabled when the hybrid VGA 400 is operating in the second mode of operation.

The second portion of the hybrid VGA 400 is similar to the first portion. In the example shown, the second portion includes an electrical path from the negative input 404 to the negative output 402, via the transistor Q46; this electrical path is enabled in both the first and the second modes of operation. The second portion also includes an electrical path from the negative input 404 to the positive output 012, via the transistor Q45; this electrical path is enabled when the hybrid VGA 400 is operating in the first mode of operation. The second portion also includes an electrical path from the negative input 404 to the voltage source Vdd, via the transistor Q44; this electrical path is enabled when the hybrid VGA 400 is operating in the second mode of operation.

The hybrid VGA 400 includes connections to control signals, in this example three control voltages $V_1$, $V_2$, $V_3$ (although fewer or greater number of control signals may be used in other implementations). The control voltage $V_1$ is used to control transistors Q41 and Q46; the control voltage $V_2$ is used to control transistors Q42 and Q45; and the control voltage $V_3$ is used to control transistors Q43 and Q44. The control voltages $V_1$, $V_2$, $V_3$ selectively enable electrical paths for the first mode of operation or the second mode of operation. For example, to operate the hybrid VGA 400 in the first mode of operation, the control voltages $V_1$, $V_2$, $V_3$ control operation of the transistors Q42 and Q45 so that these transistors allow at least some current to flow (e.g., at least partially turning on the transistors Q42, Q45), and at the same time control operation of the transistors Q43 and Q44 so that these transistors inhibit current flow (e.g., turning off the transistors Q43, Q44). To operate the hybrid VGA 400 in the second mode of operation, for example, the control voltages $V_1$, $V_2$, $V_3$ control operation of the transistors Q43 and Q44 so that these transistors allow at least some current to flow (e.g., at least partially turning on the transistors Q43, Q44), and at the same time control operation of the transistors Q42 and Q45 so that these transistors inhibit current flow (e.g., turning off the transistors Q42, Q45). At the same time, the control voltages $V_1$, $V_2$, $V_3$ are used for current steering, to control the amount or percentage of total current flowing in the different enabled electrical paths.

To help in understanding the hybrid VGA 400, the hybrid VGA 400 may be viewed as having first and second differential amplifiers that are coupled by common transistors Q41 and Q46.

The first differential amplifier is now described with reference to FIG. 4B. The hybrid VGA 400 operates using the first differential amplifier when the electrical paths shown in solid lines are enabled and current flow is inhibited for the paths shown in dashed lines, in the first mode of operation. The first differential amplifier includes a first common transistor Q41, a second common transistor Q46 and a first plurality of transistors Q42, Q45 (indicated by dashed box 412). In the first plurality of transistors, the transistor Q42 cross-connects the positive input 403 to the negative output 402 and the transistor Q45 cross-connects the negative input 404 to the positive output 401. Such a configuration, in which the first common transistor Q41 is coupled between a positive output and a positive input, the second common transistor Q46 is coupled between a negative output and a negative input, and the first plurality of transistors Q42, Q45 cross-connects the positive/negative inputs to the negative/positive outputs, may be referred to as a cross-connected topology. Operation of the hybrid VGA 400 using this first differential amplifier, in the first mode of operation, provides good linearity at low gains.

The second differential amplifier is now described with reference to FIG. 4C. The hybrid VGA 400 operates using the second differential amplifier when the electrical paths shown in solid lines are enabled and current flow is inhibited for the paths shown in dashed lines, in the second mode of operation. The second differential amplifier includes the first common transistor Q41, the second common transistor Q46 and a second plurality of transistors Q43, Q44 (indicated by dashed box 411). Each of the second plurality of transistors Q43, Q44 is tied to the voltage source Vdd. Such a configuration, in which the first common transistor Q41 is coupled between a positive output and a positive input, the second common transistor Q46 is coupled between a negative output and a negative input, and the second plurality of transistors Q43, Q44 is coupled between the voltage source Vdd and the positive/negative inputs, may be referred to as a tied-to-Vdd topology. Operation of the hybrid VGA 400 using this second differential amplifier, in the second mode of operation, provides good linearity at high gains.

As discussed above, control signals, in this example three control voltages $V_1$, $V_2$, $V_3$, control operation of the transistors, to cause the hybrid VGA 400 to operate in the first or the second mode of operation. The first control voltage $V_1$ is for example connected to the first and second common transistors Q41, Q46; the second control voltage $V_2$ is for example connected to the first plurality of transistors Q42, Q45; and the third control voltage $V_3$ is for example connected to the second plurality of transistors Q43, Q44. The control voltages $V_1$, $V_2$, $V_3$ may then be used to turn the transistors on or off as appropriate, to operate in the first mode of operation (using the first differential amplifier—see FIG. 4B) or the second mode of operation (using the second differential amplifier—see FIG. 4C), as well as for current steering, as discussed previously.

Accordingly, in the illustrated example, the control voltages $V_1$, $V_2$, $V_3$ enable the hybrid VGA 400 to operate as a current steering amplifier. In FIG. 4A, the hybrid VGA 400 is illustrated as being implemented using bipolar transistors, however the hybrid VGA 400 may be implemented using any type of transistors. In the case where the hybrid VGA 400 is implemented using BJTs or HBTs, as shown in FIG. 4A, the hybrid VGA 400 operates as a common-base amplifier, in which the input signal injects into the emitter of each transistor and flows out through the collector of each transistor. In some examples, different types of transistors may be used, and the hybrid VGA 400 may instead operate as a cascode amplifier or a common-emitter amplifier.

Reference is made again to FIG. 4A. In operation, control voltages $V_1$, $V_2$, $V_3$ are provided (e.g., by a control circuit or a processor) to enable the hybrid VGA 400 to operate in the first mode or the second mode of operation, depending on the desired performance of the hybrid VGA 400.

For example, when the desired gain of the hybrid VGA 400 is low, the hybrid VGA 400 can be operated using the first mode of operation (i.e., using the first differential amplifier, having the cross-connected topology). To achieve this, the control voltage $V_3$ is set to control transistors Q43 and Q44 to inhibit current flow (e.g., turn off). The control voltages $V_1$ and $V_2$ may then be used to perform current steering by controlling operation of transistors Q41, Q42, Q45 and Q46, to amplify the input signal with the desired gain.

When the desired gain of the hybrid VGA 400 is high, the hybrid VGA 400 can be operated using the second mode of operation (i.e., using the second differential amplifier, having the tied-to-Vdd topology). To achieve this, the control voltage $V_2$ is set to control transistors Q42 and Q45 to inhibit current flow (e.g., turn off). The control voltages $V_1$ and $V_3$ may then be used to perform current steering by controlling operation of transistors Q41, Q43, Q44 and Q46, to amplify the input signal with the desired gain.

By way of non-limiting example, in one possible configuration, the positive output 401 is coupled to the voltage source Vdd via an inductor 405, the negative output 402 is coupled to the voltage source Vdd via another inductor 406; the positive input 403 is coupled to ground via an inductor 407, and the negative input 404 is coupled to ground via another inductor 408. Although inductors are shown in this example, other loads, such as capacitors and resistors, as well as combinations of capacitors, inductors and/or resistors, are possible. In various examples, a bias voltage or a bias current in the hybrid VGA 400 may be set in any suitable way.

In the example shown, the hybrid VGA 400 is implemented using bipolar transistors, such as BJTs or HBTs, and the control voltages $V_1$, $V_2$, $V_3$ are connected to the bases of the transistors to control operation of the transistors. The hybrid VGA 400 may be implemented using other types of transistors, and controlled using appropriate control voltages. For example, the hybrid VGA 400 may be implemented using FETs, such as metal-oxide semiconductor field-effect transistors (MOSFETs) or high-electron-mobility transistors (HEMTs), and the control voltages may be connected to the gates of the transistors to control operation of the transistors in the manner discussed above. In other examples, implementation may use other transistors, such as other types of FETs (including metal-semiconductor field-effect transistors (MESFETs)), other types of bipolar transistors, and others. As used herein, "transistor" generically refers to any active circuit, and is not limited to the particular implementation shown in the figures. In various examples, the transistors used in the hybrid VGA 400 may be of different sizes, for example according to a gain specification.

Figure 4D:
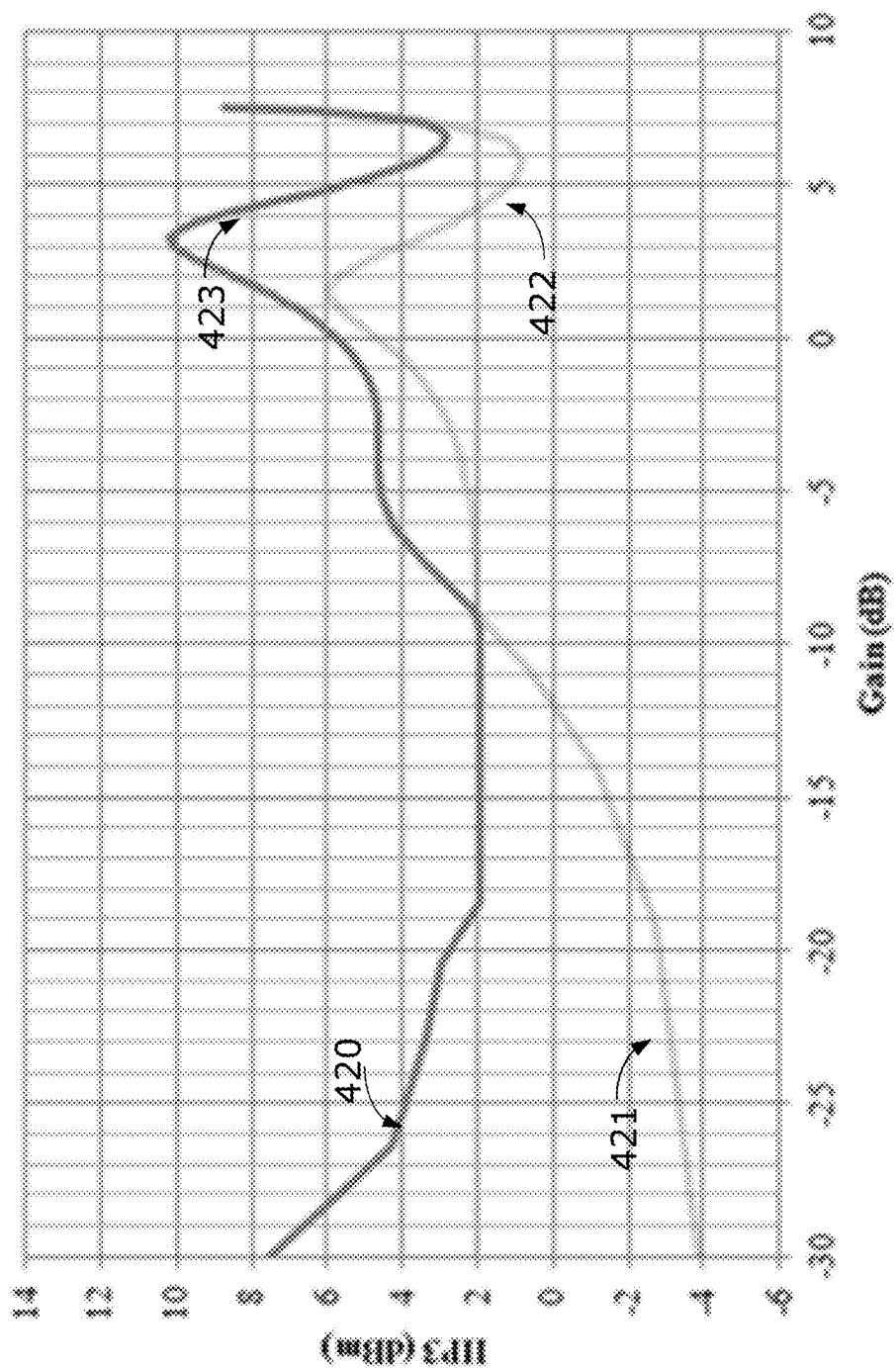
FIG. 4D is a plot of IIP3 versus gain of the example hybrid variable gain amplifier of FIG. 4A.

FIG. 4D presents an IIP3 plot versus gain of the example hybrid VGA 400. As shown in FIG. 4D, at lower gains (e.g., in the range of about −30 dB to about −10 dB), the performance of the hybrid VGA 400 (indicated by 420) shows improvement over the performance of the conventional VGA 200 of FIG. 2A (indicated by 421). This is because at lower gains, the hybrid VGA 400 may be operated in the first mode of operation, which has good linearity at lower gains. At higher gains (e.g., in the range of about −10 dB to about 10 dB), the performance of the hybrid VGA 400 (indicated by 423) shows improvement over the performance of the conventional VGA 300 of FIG. 3A (indicated by 422). This is because at higher gains, the hybrid VGA 400 may be operated in the second mode of operation, which has good linearity at higher gains. Generally, the hybrid VGA 400 may be controlled to operate in either the first or the second mode of operation, in order to maintain good linearity over a wider dynamic range than is possible using the conventional VGAs 200, 300. Further, the example disclosed hybrid VGA 400 may be implemented, with no significant increase in power consumption, die area or gain penalty.

Figure 5:
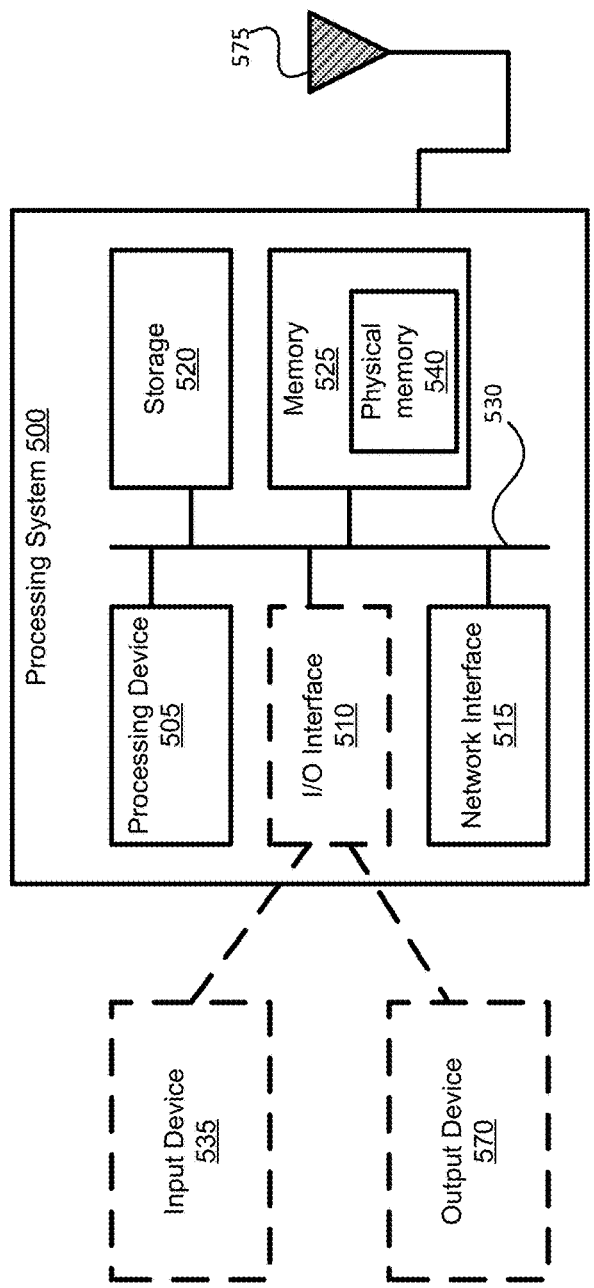
FIG. 5 is a schematic representation of an example processing system which may be used to control the example hybrid variable gain amplifier of FIG. 4A.

FIG. 5 is a schematic diagram of an example processing system 500, which may be used to implement the methods and systems disclosed herein. For example, the processing system 500 may be used for a portable device or a base station implemented in 5G communication networks, and including a hybrid VGA as disclosed above. The processing system 500 may also be used to control operation of the hybrid VGA, as discussed further below. Other processing systems suitable for implementing examples described in the present disclosure may be used, which may include components different from those discussed below. Although FIG. 5 shows a single instance of each component, there may be multiple instances of each component in the processing system 500 and the processing system 500 could be implemented using parallel and/or distributed systems.

The processing system 500 may include one or more processing devices 505, such as a processor, a microprocessor, an application-specific integrated circuit (ASIC), a field-programmable gate array (FPGA), a dedicated logic circuitry, or combinations thereof. The processing system 500 may also include one or more optional input/output (I/O) interfaces 510, which may enable interfacing with one or more optional input devices 535 and/or output devices 570. The processing system 500 may include one or more network interfaces 515 for wired or wireless communication with a network (e.g., an intranet, the Internet, a P2P network, a WAN and/or a LAN, and/or a Radio Access Network (RAN)) or other node. The network interfaces 515 may include one or more interfaces to wired networks and wireless networks. Wired networks may make use of wired links (e.g., Ethernet cable). Wireless networks, where they are used, may make use of wireless connections transmitted over an antenna such as antenna 575. The network interfaces 515 may provide wireless communication via one or more transmitters or transmit antennas and one or more receivers or receive antennas, for example. In this example, a single antenna 575 is shown, which may serve as both transmitter and receiver. However, in other examples there may be separate antennas for transmitting and receiving. The processing system 500 may also include one or more storage units 520, which may include a mass storage unit such as a solid state drive, a hard disk drive, a magnetic disk drive and/or an optical disk drive.

The processing system 500 may include one or more memories 525 that can include physical memory 540, which may include a volatile or non-volatile memory (e.g., a flash memory, a random access memory (RAM), and/or a read-only memory (ROM)). The non-transitory memories 525 (as well as storage 520) may store instructions for execution by the processing devices 505, such as to carry out methods such as those described in the present disclosure. The memories 525 may include other software instructions, such as for implementing an operating system (OS), and other applications/functions. In some examples, one or more data sets and/or modules may be provided by an external memory (e.g., an external drive in wired or wireless communication with the processing system 500) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

There may be a bus 530 providing communication among components of the processing system 500. The bus 530 may be any suitable bus architecture including, for example, a memory bus, a peripheral bus or a video bus. Optional input devices 535 (e.g., a keyboard, a mouse, a microphone, a touchscreen, and/or a keypad) and optional output devices 570 (e.g., a display, a speaker and/or a printer) are shown as external to the processing system 500, and connected to optional I/O interface 510. In other examples, one or more of the input devices 535 and/or the output devices 570 may be included as a component of the processing system 500.

The hybrid VGA may be included as a component of the processing system 500, for example as a component in the signal path for transmitting and receiving signals using the antenna 575. The processing system 500 may also be used to control operation of the hybrid VGA.

Figure 6:
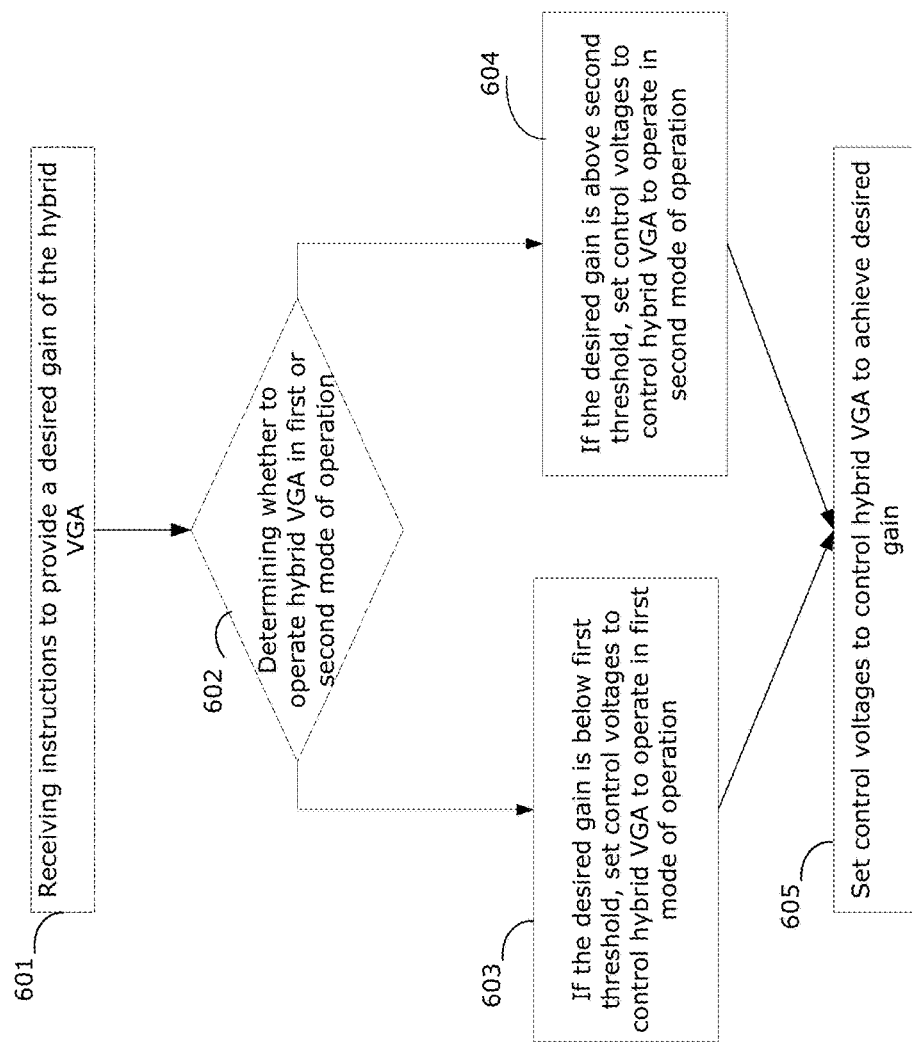
FIG. 6 is a flowchart of a method carried out by the processing system of FIG. 5 according to example embodiments.

FIG. 6 illustrates an example of a method that may be implemented using the processing system 500 to control the hybrid VGA to operate in the first or the second mode of operation. In some examples, instructions that cause the processing device 505 to carry out the method shown in FIG. 6 may be stored in the storage 520 of the processing system 500.

The method includes, optionally, at 601, receiving instructions to provide a desired gain of the hybrid VGA. In some examples, the desired gain of the hybrid VGA may be set without receiving external instructions (e.g., the desired gain may be set according to an internal determination by the processing system or according an internal feedback loop of the hybrid VGA).

The hybrid VGA is controlled by setting the control voltages (e.g., $V_1$, $V_2$, $V_3$ in the example of FIG. 4A), depending on the desired gain, such that the hybrid VGA operates in the first or the second mode of operation.

At 602, it is determined whether the hybrid VGA is to operate in the first mode or the second mode of operation. This may be determined using a comparison with threshold values, which may be preset or changed dynamically, for example. The threshold values may be set according to the device specification and/or expected operation of the hybrid VGA (e.g., whether the hybrid VGA is designed for mostly high gain or mostly low gain). In some examples, the threshold values may be changed dynamically (e.g., in real-time response to input signals), according to different desired performance and/or conditions.

At 603, if the desired gain is below a first threshold, then the control voltages are set to control the hybrid VGA to operate in the first mode of operation, because the first mode of operation has better linearity for lower gains.

At 604, if the desired gain at or above a second threshold, the control voltages are set to control the hybrid VGA to operate in the second mode of operation, because the second mode of operation has better linearity for higher gains.

The first and second threshold values may be equal, so that there is effectively a single threshold value that the desired gain is compared against.

The first and second threshold values may be different, with the first threshold value being lower in value than the second threshold value. This may enable a hysteresis effect. When the desired gain is below the first threshold value, the first mode of operation is used; when the desired gain is above the second threshold value, the second mode of operation is used; and when the desired gain is between the first and second threshold values, the currently used mode of operation, whether first mode or second mode, is maintained. This hysteresis effect may avoid frequent switching between the two modes of operation, and may help to provide greater stability in performance.

At 605, the control voltages are further set to control the hybrid VGA so as to achieve the desired gain. In the example hybrid VGA of FIG. 4A, the control voltages are used for current steering to control the gain that is obtained.

In the present disclosure, an example hybrid VGA is described, as well as a method and system for controlling the operation of the hybrid VGA. By adjusting the control voltages, the hybrid VGA can be controlled to operate using an appropriate mode of operation, in order to improve linearity, over both high and low gains, compared to conventional VGAs. The example disclosed hybrid VGA may be implemented with little or no negative impact to the size of the circuitry, compared to conventional VGAs.

In various examples, the hybrid VGA may have increased power handling capability at both high and low gain. The example disclosed hybrid VGA may be used in portable devices and base stations, for example in a 5G communication system, to boost performance with little or no battery usage penalty, because the hybrid VGA has little or no negative impact on efficiency and power consumption.

In some examples, the disclosed hybrid VGA may use only two extra transistors and require negligible increase in control circuitry (for example requiring only a few additional analog multiplexers and digital control gates), compared to a conventional amplifier. Thus, the complexity in the RF circuitry design for the hybrid VGA may be increased insignificantly. Further, the maximum possible gain may be unchanged. The disclosed hybrid VGA may provide a greater degree of freedom to design for both gain and linearity specifications. The disclosed hybrid VGA may also be implemented using digital control.

Although the present disclosure describes methods and processes with steps in a certain order, one or more steps of the methods and processes may be omitted or altered as appropriate. One or more steps may take place in an order other than that in which they are described, as appropriate.

Although the present disclosure is described, at least in part, in terms of methods, a person of ordinary skill in the art will understand that the present disclosure is also directed to the various components for performing at least some of the aspects and features of the described methods, be it by way of hardware components, software or any combination of the two. Accordingly, the technical solution of the present disclosure may be embodied in the form of a software product. A suitable software product may be stored in a pre-recorded storage device or other similar non-volatile or non-transitory computer readable medium, including DVDs, CD-ROMs, USB flash disk, a removable hard disk, or other storage media, for example. The software product includes instructions tangibly stored thereon that enable a processing device (e.g., a personal computer, a server, or a network device) to execute examples of the methods disclosed herein.

Certain adaptations and modifications of the described embodiments can be made. Therefore, the above discussed embodiments are considered to be illustrative and not restrictive. Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A hybrid variable gain amplifier (VGA) comprising:
a positive input and a negative input, a positive output and a negative output;
a first portion of the VGA that is configured to: provide an electrical path for current to flow between the positive input and the positive output in both a first mode of operation and a second mode of operation, provide an electrical path for current to flow between the positive input and the negative output in the first mode of operation only, and provide an electrical path for current to flow between the positive input and a voltage source in the second mode of operation only; and a second portion of the VGA that is configured to: provide an electrical path for current to flow between the negative input and the negative output in both the first mode of operation and the second mode of operation, provide an electrical path for current to flow between the negative input and the positive output in the first mode of operation only, and provide an electrical path for current to flow between the negative input and the voltage source in the second mode of operation only;

each of the first and second portions of the VGA including connections to control voltages to selectively enable the electrical paths in the first mode of operation or the electrical paths in the second mode of operation, the control voltages further controlling amount of current flow in the enabled electrical paths.

2. The hybrid VGA of claim 1, comprising a plurality of transistors to provide the respective electrical paths, the plurality of transistors including:

a first transistor coupled between the positive input and the negative output, the first transistor being coupled directly to the positive input and directly to the negative output;

a second transistor coupled between the positive input and the voltage source, the second transistor being coupled directly to the positive input and directly to the voltage source;

a third transistor coupled between the negative input and the positive output, the third transistor being coupled directly to the negative input and directly to the positive output; and a fourth transistor coupled between the negative input and the voltage source, the fourth transistor being coupled directly to the negative input and directly to the voltage source;

wherein the first, second, third and fourth transistors are controlled by the control voltages to:

enable at least some current to flow across the first and third transistors, and inhibit current flow across the second and fourth transistors, in the first mode of operation; and enable at least some current to flow across the second and fourth transistors, and inhibit current flow across the first and third transistors, in the second mode of operation.

3. The hybrid VGA of claim 2, wherein the first portion of the VGA further includes:
a fifth transistor coupled between the positive input and the positive output, the fifth transistor being coupled directly to the positive input and directly to the positive output;

wherein the second portion of the VGA further includes:
a sixth transistor coupled between the negative input and the negative output, the sixth transistor being coupled directly to the negative input and directly to the negative output; and wherein the control voltages control the first to sixth transistors to selectively enable the electrical paths in the first mode of operation or the second mode of operation by:
controlling the first and third transistors to allow at least some current flow and controlling the second and fourth transistors to inhibit current flow, in the first mode of operation; or
controlling the second and fourth transistors to allow at least some current flow and controlling the first and third transistors to inhibit current flow, in the second mode of operation.

4. The hybrid VGA of claim 3, wherein the control voltages comprise a first control voltage connected to the fifth and sixth transistors, a second control voltage connected to the first and third transistors, and a third control voltage connected to the second and fourth transistors; and wherein the first, second and third control voltages are used together to selectively enable the electrical paths in the first mode of operation or the second mode of operation, and to control amount of current flow in the enabled electrical paths.

5. The hybrid VGA of claim 4, wherein the plurality of transistors are bipolar junction transistors (BJTs) or heterojunction bipolar transistors (HBTs), and wherein the control voltages are connected to the bases of the transistors to control operation of the VGA to operate in the first mode of operation or the second mode of operation, and to control amount of current flowing in the enabled electrical paths in each mode of operation.

6. The hybrid VGA of claim 4, wherein the plurality of transistors are metal-oxide semiconductor field-effect transistors (MOSFETs) or high-electron-mobility transistors (HEMTs), and wherein the control voltages are connected to the gates of the transistors to control operation of the VGA to operate in the first mode of operation or the second mode of operation, and to control amount of current flowing in the enabled electrical paths in each mode of operation.

7. A hybrid variable gain amplifier (VGA) comprising:

a positive input and a negative input, a positive output and a negative output;

a first differential amplifier and a second differential amplifier, the first differential amplifier having a first plurality of transistors and a set of common transistors, the second differential amplifier having a second plurality of transistors and the set of common transistors;

the first and second differential amplifiers being coupled to each other by the set of common transistors, the set of common transistors including a first common transistor and a second common transistor, the first common transistor being coupled between the positive output and the positive input, and the second common transistor being coupled between the negative output and the negative input;

in the first differential amplifier, the first plurality of transistors cross-connecting the negative input to the positive output and the positive input to the negative output;

in the second differential amplifier, the second plurality of transistors being tied to a voltage source;

the first and second differential amplifiers including connections to control voltages to control operation of the hybrid VGA in a first mode of operation using the first differential amplifier or in a second mode of operation using the second differential amplifier, and to control current steering in the first differential amplifier when using the first mode of operation, or current steering in the second differential amplifier when using the second mode of operation.

8. The hybrid VGA of claim 7, wherein the control voltages comprise a first control voltage connected to the first and second common transistors, a second control voltage connected to the first plurality of transistors in the first differential amplifier, and a third control voltage connected to the second plurality of transistors in the second differential amplifier; and wherein the first, second and third control voltages are used together to control operation of the hybrid VGA in either the first mode of operation or the second mode of operation, and are used together to control current steering in either the first mode of operation or the second mode of operation.

9. The hybrid VGA of claim 8, wherein the first, second and third control voltages control the first plurality of transistors to allow at least some current flow and the second plurality of transistors to inhibit current flow, to control operation of the hybrid VGA in the first mode of operation; control the second plurality of transistors to allow at least some current flow and the first plurality of transistors to inhibit current flow, to control operation of the hybrid VGA in the second mode of operation; and control the set of common transistors to allow at least some current flow in both the first mode of operation and the second mode of operation.

10. The hybrid VGA of claim 7,
wherein the first plurality of transistors includes:
a third transistor coupled between the positive input and the negative output, the third transistor being coupled directly to the positive input and directly to the negative output; and
a fourth transistor coupled between the negative input and the positive output, the fourth transistor being coupled directly to the negative input and directly to the positive output;
wherein the second plurality of transistors includes:
a fifth transistor cross-connecting the positive input to the voltage source, the fifth transistor being coupled directly to the positive input and directly to the voltage source; and
a sixth transistor cross-connecting the negative input to the voltage source, the sixth transistor being coupled directly to the negative input and directly to the voltage source;
wherein the control voltages control operation of the hybrid VGA in either the first mode of operation or the second mode of operation by:
controlling the third and fourth transistors to allow at least some current flow and controlling the fifth and sixth transistors to inhibit current flow in the first mode of operation; or
controlling the fifth and sixth transistors to allow at least some current flow and controlling the third and fourth transistors to inhibit current flow in the second mode of operation; and
wherein the control voltages control the set of common transistors to allow at least some current flow in both the first mode of operation and the second mode of operation.

11. The hybrid VGA of claim 7, wherein the first and second common transistors, the first plurality of transistors and the second plurality of transistors are bipolar junction transistors (BJTs) or heterojunction bipolar transistors (HBTs), and wherein the control voltages are connected to the bases of the transistors to control operation of the VGA to operate in the first mode of operation or the second mode of operation, and to control current steering in the first differential amplifier when using the first mode of operation, or current steering in the second differential amplifier when using the second mode of operation.

12. The hybrid VGA of claim 7, wherein the first and second common transistors, the first plurality of transistors and the second plurality of transistors are metal-oxide semiconductor field-effect transistors (MOSFETs) or high-electron-mobility transistors (HEMTs), and wherein the control voltages are connected to the gates of the transistors to control operation of the VGA to operate in the first mode of operation or the second mode of operation, and to control current steering in the first differential amplifier when using the first mode of operation, or current steering in the second differential amplifier when using the second mode of operation.

13. A method for controlling a hybrid variable gain amplifier (VGA), wherein the VGA is controllable to operate in a first mode of operation or in a second mode of operation, wherein in the first mode of operation the hybrid VGA provides an electrical path for current to flow from a positive input to a negative output and from a negative input to a positive output, in the second mode of operation the hybrid VGA provides an electrical path for current to flow from the positive input to a voltage source and from the negative input to the voltage source, and in both the first mode of operation and the second mode of operation the hybrid VGA provides an electrical path for current to flow from the positive input to the positive output and from the negative input to the negative output, the method comprising:
when a desired gain is below a first threshold value, setting the control voltages to control the hybrid VGA to operate in the first mode of operation;
when the desired gain is at or above a second threshold value, setting the control voltages to control the hybrid VGA to operate in the second mode of operation; and
further setting the control voltages to achieve the desired gain.

14. The method of claim 13, wherein the first threshold value is lower in value than the second threshold value; and wherein, when the desired gain is between the first and second threshold values, controlling the hybrid VGA to operate in a current mode of operation.

15. The method of claim 13, wherein the first and second threshold values are equal.

16. The method of claim 13,
wherein the hybrid VGA includes:
a first transistor coupled between the positive input and the negative output, the first transistor being coupled directly to the positive input and directly to the negative output;
a second transistor coupled between the positive input and the voltage source, the second transistor being coupled directly to the positive input and directly to the voltage source;
a third transistor coupled between the negative input and the positive output, the third transistor being coupled directly to the negative input and directly to the positive output; and
a fourth transistor coupled between the negative input and the voltage source, the fourth transistor being coupled directly to the negative input and directly to the voltage source; and
wherein setting the control voltages to control the hybrid VGA to operate in the first mode of operation includes setting the control voltages to enable at least some current to flow across the first and third transistors and inhibit current flow across the second and fourth transistors to turn off; and
wherein setting the control voltages to control the hybrid VGA to operate in the second mode of operation includes setting the control voltages to enable at least some current to flow across the second and fourth transistors and inhibit current flow across the first and third transistors to turn off.

* * * * *